United States Patent
Graham et al.

(10) Patent No.: US 11,824,317 B2
(45) Date of Patent: Nov. 21, 2023

(54) WIRE NUT ELECTRICAL CONNECTOR

(71) Applicants: Lyndon Graham, Kirksville, MO (US); Tammy Graham, Kirksville, MO (US)

(72) Inventors: Lyndon Graham, Kirksville, MO (US); Tammy Graham, Kirksville, MO (US)

(*) Notice: Subject to any disclaimer, the term of this patent is extended or adjusted under 35 U.S.C. 154(b) by 0 days.

(21) Appl. No.: 17/351,897

(22) Filed: Jun. 18, 2021

(65) Prior Publication Data

US 2022/0224023 A1    Jul. 14, 2022

Related U.S. Application Data

(60) Provisional application No. 63/137,273, filed on Jan. 14, 2021.

(51) Int. Cl.
*H01R 4/22* (2006.01)
*G01R 15/12* (2006.01)
*H01R 4/12* (2006.01)

(52) U.S. Cl.
CPC .............. *H01R 4/22* (2013.01); *G01R 15/125* (2013.01); *H01R 4/12* (2013.01)

(58) Field of Classification Search
CPC .................................. H01R 4/22; F16B 37/12
See application file for complete search history.

(56) References Cited

U.S. PATENT DOCUMENTS

| | | | | |
|---|---|---|---|---|
| 3,056,851 A | * | 10/1962 | Scott | H01R 4/22 |
| | | | | D13/150 |
| 3,440,333 A | * | 4/1969 | Blomstrand | H01R 4/22 |
| | | | | 411/929 |
| 4,883,921 A | * | 11/1989 | Legerius | H01R 4/22 |
| | | | | 174/84 S |
| 5,312,214 A | * | 5/1994 | Morton | F16B 37/12 |
| | | | | 411/324 |
| 6,730,847 B1 | * | 5/2004 | Fitzgerald | H02G 15/043 |
| | | | | 174/76 |
| 2006/0042079 A1 | * | 3/2006 | King | H01R 43/24 |
| | | | | 29/838 |

FOREIGN PATENT DOCUMENTS

GB    2415475    * 12/2005

* cited by examiner

*Primary Examiner* — Chau N Nguyen
(74) *Attorney, Agent, or Firm* — Brennan, Manna & Diamond, LLC

(57) ABSTRACT

This present invention relates to an electric testing assistance tool in the form a wire nut or electrical connector. The tool is a funnel shaped flame resistant and insulating device and has a top end and a bottom end with curved walls. The top end includes a central hole to receive a testing probe of a tester device. The device has an internal metal spiral thread connected to a metal ball connector. The metal spiral thread twistable about a plurality of wire end leads. The leads extending from the bottom end opening are connected to a target wiring whose electrical parameters and continuity is to be measured using the electric testing assistance tool. The testing probe can be inserted through the central hole to contact the metal ball to measure the electric parameters and continuity of the target wiring.

7 Claims, 3 Drawing Sheets

WIRE NUT ELECTRICAL CONNECTOR

CROSS-REFERENCE TO RELATED APPLICATION

The present application claims priority to, and the benefit of, U.S. Provisional Application No. 63/137,273, which was filed on Jan. 14, 2021 and is incorporated herein by reference in its entirety.

FIELD OF THE INVENTION

The present invention relates generally to the field of electrical connectors. More specifically, the present invention relates to an improved wire nut or electrical connector that enables a user to easily test wire leads for electricity, connection, low voltage or other issues. The improved wire nut or electrical connector is comprised of a funnel-shaped housing with an interior metal spiral thread, and a relatively small opening at the top end of the housing to allow a testing probe to be easily inserted into the housing to test the wire leads contained therein. The device offers a convenient solution for testing wires, and eliminates the need to disassemble the connection to test the wires contained therein. Accordingly, the present disclosure makes specific reference thereto. Nonetheless, it is to be appreciated that aspects of the present invention are also equally applicable to other like applications, devices and methods of manufacture.

BACKGROUND OF THE INVENTION

By way of background, electrical connectors are electromechanical devices that are widely used in electronic products such as computers, personal digital assistants and many more devices, to join electrical conductors such as wires, and provide electrical connections and signal transmission between electronic devices. Various types of electrical connectors such as twist-on wire connectors (also known as wire nuts, wire connectors, cone connectors or thimble connectors), and more are available in the market, that simply allow fastening of two or more electrical connectors or wire leads to create an electrical circuit. In order to ensure performance and quality of the electrical circuit, the electrical connector performance and the performance of the wire leads are required to be tested.

Traditionally, a test system for evaluating an electrical connector includes a circuit board and a test instrument, to which the electrical connector to be tested for electricity, low voltage or other parameters is attached. The electrical connector to be tested generally includes an insulative housing and a plurality of conductive wire lead terminals. The insulative housing has a cavity, and the conductive terminals are received in the cavity. Test instruments typically include two different types of test heads, a clip-type and a probe-type. Electrical connections include multiple wires and cables, so when the clip-type test head is used, the pitch of the conductive terminals is small, and it is not easy to accurately clamp a clip-type test head to the lead wire ends. Additionally, when the probe type test head is used, the probe-type test head tends to slip on the conductive terminals, thereby causing misdetection of the electrical connector to be tested.

The existing electrical connectors have other drawbacks as well. To test the performance of the electrical connector connection, the user is required to push the tester leads up inside the connector to test for power, and if there are too many wires connected, the user has to take off the electrical connector, such as wire nuts or wire caps, to test the wires. This process takes time and energy and can result in a loss of productivity. The resultant test can be unreliable, as the test is conducted when the connector is removed. The connection of the wire leads can change when the connector is placed back onto the wire leads.

Therefore, there exists a long felt need in the art for an improved electrical connector that may be used by professionals or homeowners to easily test the wires and electrical connectors for electricity, low voltage and other parameters. There is a long felt need in the art for an improved wire nut that does not require the user to insert the testing leads inside the wire nuts to test the wires. Further, there is a long felt need in the art for an improved wire nut that eliminates the need to remove the wire caps or wire nuts to test the wires. Furthermore, there is a long felt need in the art for an improved wire nut that allows quick and easy testing of wires, and therefore saves the time of the user. There is a long felt need in the art for an improved electrical connector that does not require the users to expend a great deal of effort in testing the wire leads connected by the electrical connector. Finally, there is a long felt need in the art for an improved wire nut that eliminates the need to take the connection apart, while still enabling accurate testing of wire leads.

The subject matter disclosed and claimed herein, in one potential embodiment, comprises an electric testing assistance tool in the form a wire nut or electrical connector. The connector comprises: a funnel-shaped flame resistant insulating device, having a top end and a bottom end; the top end having a smaller diameter than the diameter of the bottom end; a central hole on the top end to receive a testing probe of a tester device; an internal metal spiral thread connected to a metal ball connection at one end and connected to a plurality of wire leads on the opposite end; the wire leads extend from the bottom end opening and are connected to a target wiring whose electrical parameters and continuity are to be measured using the electric testing assistance tool; and, the testing probe touches the metal ball to measure the electric parameters and continuity of the target wiring.

The improved wire nut or electrical connector of the present invention overcomes the drawbacks of the existing electrical connectors. The improved wire nut or electrical connector of the present invention features a small plastic or thermoplastic housing, including a small hole in a top end of the housing where the test leads are inserted for testing voltage or continuity. The opening at the top end of the housing eliminates the need to remove the wires for testing, saves time and improves the accuracy of the electrical test.

In this manner, the improved wire nut or electrical connector of the present invention accomplishes all of the forgoing objectives, and provides a relatively safe, convenient and quick solution to test the performance of the electrical connector connections and the wire leads. The improved wire nut of the present invention is also user-friendly, as it does not require the users to take off the wire caps to test the performance of the wire leads, and saves the time and effort of the testers.

SUMMARY

The following presents a simplified summary in order to provide a basic understanding of some aspects of the disclosed innovation. This summary is not an extensive overview, and it is not intended to identify key/critical elements or to delineate the scope thereof. Its sole purpose is to present some general concepts in a simplified form as a prelude to the more detailed description that is presented later.

The subject matter disclosed and claimed herein, in one embodiment thereof, comprises an electric testing assistance tool in the form a wire nut or electrical connector comprising of a funnel-shaped flame-resistant insulating device having a top end and a bottom end, the top end having a smaller diameter than the diameter of the bottom end, a central hole on the top end to receive a testing probe of a tester device, an internal metal spiral thread connected to a metal ball connection at one end, and connected to a plurality of wire leads on the opposite end, wherein the wire leads extend from the bottom end opening, the wire leads are connected to a target wiring whose electrical parameters and continuity are to be measured using the electric testing assistance tool, and the testing probe touches the metal ball to measure the electric parameters and continuity of the target wiring. The tester device is connected to an electric parameter measuring device to record and display the measured parameters.

In a further embodiment of the present invention, a method of testing for voltage or continuity of a wiring or a connector is disclosed and comprises: connecting one or more wire leads extending from a bottom end of a wire nut device to the wiring or the connector; inserting a probing lead into a hole on a top end of the wire nut device wherein the probing lead is connected to a measuring device such as an ammeter, a voltmeter or any other similar device through a wire; and, the probing lead maintains an electrical connection with the wiring or the connector through a metal ball and an internal metal spiral thread present within the wire nut device.

In yet a further embodiment of the present invention, a method for testing an electrical connection of wire leads is disclosed. The method comprises: providing a wire lead connector for retaining and testing at least two wire leads connected therewith; the wire lead connector including a connector housing having an open bottom end and a partially open top; the partially open top end comprises a central hole; providing a metal spiral thread having an open bottom end and a closed top end; threading the metal spiral thread inside the connector housing, wherein the spiral thread closed top end spaced below the central hole; turning the wire lead connector onto at least two wire leads; inserting a testing probe of a tester device into the central hole; contacting the spiral thread closed top end with the testing probe; and, determining an electrical connection of the at least two wire leads.

The subject matter disclosed and claimed herein, in another embodiment thereof, comprises: an improved wire nut or electrical connector comprising a small plastic funnel or tapered structure with an interior metal spiral thread having a solid end; a small hole at the top end; a small metal ball proximal to the hole; and, a plurality of wire leads attached to the interior of the funnel structure. The improved wire nut or electrical connector can be used by professionals or homeowners for testing electricity or low voltage. The small hole on the top end of the wire nut structure allows a user to insert a test lead or probe within the connector for testing voltage, power, continuity or other parameters.

The advantage of the present invention is that it provides a small plastic funnel or tapered electric testing assistance device with an interior metal spiral thread with a solid end, and a small hole in the plastic housing at the top end for inserting an electric testing probe therethrough. The device may come in different colors and different sizes. The device is useful to measure electrical characteristics of any type of wiring, circuit, connector or electrical connection. The device is lightweight, portable and cost-effective.

To the accomplishment of the foregoing and related ends, certain illustrative aspects of the disclosed innovation are described herein in connection with the following description and the annexed drawings. These aspects are indicative, however, of but a few of the various ways in which the principles disclosed herein can be employed and are intended to include all such aspects and their equivalents. Other advantages and novel features will become apparent from the following detailed description when considered in conjunction with the drawings.

BRIEF DESCRIPTION OF THE DRAWINGS

The description refers to provided drawings in which similar reference characters refer to similar parts throughout the different views, and in which.

DETAILED DESCRIPTION

Figure 1:
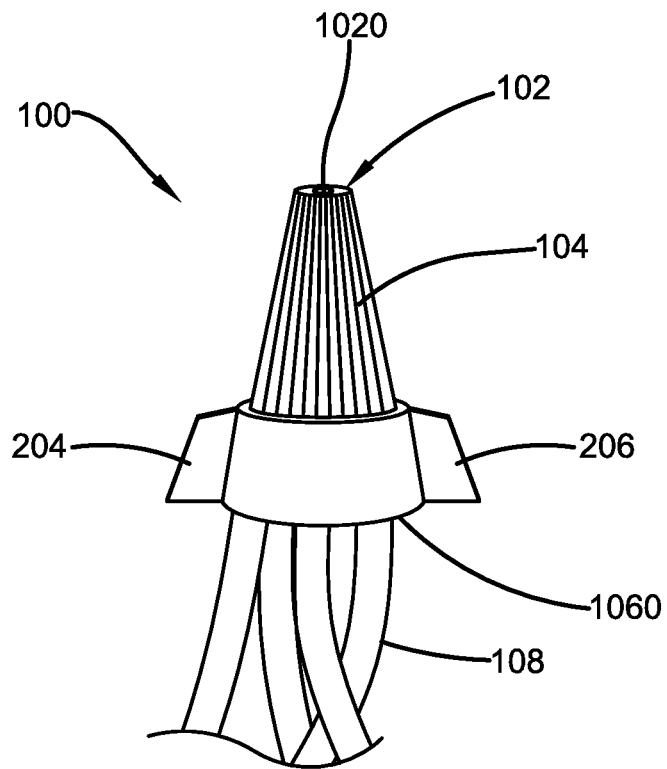
FIG. 1 illustrates a perspective view of one potential embodiment of the wire nut electric connector of the present invention in accordance with the disclosed structure, wherein the connector is removably attached to a plurality of electric wires.

The innovation is now described with reference to the drawings, wherein like reference numerals are used to refer to like elements throughout. In the following description, for purposes of explanation, numerous specific details are set forth in order to provide a thorough understanding thereof. It may be evident, however, that the innovation can be practiced without these specific details. In other instances, well-known structures and devices are shown in block diagram form in order to facilitate a description thereof. Various embodiments are discussed hereinafter. It should be noted that the figures are described only to facilitate the description of the embodiments. They are not intended as an exhaustive description of the invention and do not limit the scope of the invention. Additionally, an illustrated embodiment need not have all the aspects or advantages shown. Thus, in other embodiments, any of the features described herein from different embodiments may be combined.

As noted above, there exists a long felt need in the art for an improved electrical connector that may be used by professionals or homeowners to easily test the wires and electrical connectors for electricity, low voltage and other parameters. There is a long felt need in the art for an improved wire nut that does not require the user to insert the testing leads inside the wire nuts to test the wires. Further, there is a long felt need in the art for an improved wire nut that eliminates the need to remove the wire caps or wire nuts to test the wires. Furthermore, there is a long felt need in the art for an improved wire nut that allows quick and easy testing of wires, and therefore saves the time of the user. There is a long felt need in the art for an improved electrical connector that does not require the users to expend a great deal of effort in testing the wire leads connected by the electrical connector. Finally, there is a long felt need in the art for an improved wire nut that eliminates the need to take the connection apart and allows accurate testing of wire leads.

The present invention, in one exemplary embodiment, is a novel electric testing assistance tool in the form of a wire nut or electrical connector comprising: a tapered flame-resistant insulating device having a top end and a bottom end; the top end having a smaller diameter than the diameter of the bottom end; a central hole on the top end to receive a testing probe of a tester device; an internal metal spiral thread including a metal ball connection at one end; a plurality of wire leads at an opposing end wherein the wire leads extend from the bottom end opening; the wire leads are connected to a target wiring whose electrical parameters and continuity are to be measured using the electric testing assistance tool; and, the testing probe touches the metal ball to measure the electric parameters and continuity of the target wiring.

Referring initially to the drawings, FIG. 1 illustrates a perspective view of one potential embodiment of the wire nut electric connector 100 of the present invention in accordance with the disclosed structure, wherein the connector 100 is removably attached to a plurality of electric wires. The improved wire nut or electric connector 100 of the present invention is in the form of a small plastic or thermoplastic tapered connector having a top end 102 and a bottom end 106. The top end 102 has a small opening 1020 generally centered at the top end 102 to receive a tester lead or probe for testing voltage or current. The bottom end 106 has the opening 1060 from which a plurality of wire leads 108 can extend therefrom. The connector 100 can be tightened around a wiring such as a copper wiring for testing and also completing a circuit.

The electric connector 100 can be in the shape of a funnel or cone, including a tapered housing 104 and having an internal metal spiral 302 for completing the circuit between the wire leads 108 and the inserted test lead. The electric connector 100 is made up of flame-retardant thermoplastic material providing electrical insulation. The internal surface of the connector 100 can be threaded to assist in securing the internal metal spiral thereto, and to secure the connection of the wire leads 108 to the internal metal spiral. The exterior surface of the connector 100 provides a secure grip and can have opposing ribs 204, 206 across the exterior surface to improve grasping ability and comfort. The hole 1020 at the top end 102 is sized as per the standard sizes of the test leads used for probing. The wire leads 108 may be integrated to the electric connector 100 or may be removably attached to the internal metal spiral within the connector 100.

It should be appreciated that the wire leads 108 can be connected to any type of wires or connectors for testing purpose and the tester lead or probe can be easily inserted into the hole 1020, thus, allowing a user to perform testing without pushing the tester leads up inside the connector or touch the main wire in which the current or voltage needs to be tested.

Also, in cases where the connector 100 is used as a wire nut, the connector 100 is not required to be removed for testing, since the tester lead can be easily inserted into the hole 1020 for testing and probing the wire or circuit. The connection between the wires is not required to be taken apart for performing testing using the connector 100 of the present invention. The connector 100 provides a cost-effective and time-saving solution for users to check issues in the wiring and perform testing with minimal effort. The wire leads 108 are easily accessible to a user to connect to the target wire or connector system for testing the current, voltage or continuity of the target wire or connector system. The diameter of the bottom end 106 has a larger diameter than the diameter of the top end 102, and the housing 104 can be tapered therebetween.

Figure 2:
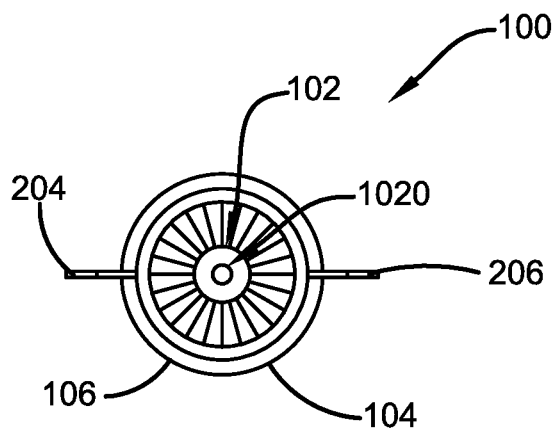
FIG. 2 illustrates a top view of one potential embodiment of the wire nut electric connector of the present invention in accordance with the disclosed structure, wherein the connector has a continuous opening in its top portion for receipt of a probe.

FIG. 2 illustrates a top view of one potential embodiment of the wire nut electric connector 100 of the present invention in accordance with the disclosed structure, wherein the connector has a continuous opening in its top portion for receipt of a probe. More specifically, a centralized hole or opening 1020 is present at top end 102 of the connector 100 that is used to insert a tester lead for performing probing and testing. The inner surface 202 is threaded, helping to secure the attachment of an internal metal spiral thread 302 for receiving wire leads. A pair of tabs 204, 206 extend outwardly from the bottom end 106 to provide assistance in securing, twisting, and operating the connector 100. The tabs 204, 206 allow a user to make a comfortable grip for rotating or fastening the connector 100. The central hole 1020 is relatively small in diameter relative to the bottom end 106, and enables a user to guide an electrical tester or probe to wire leads within the connector 100 without having to remove a connector cap.

Figure 3:
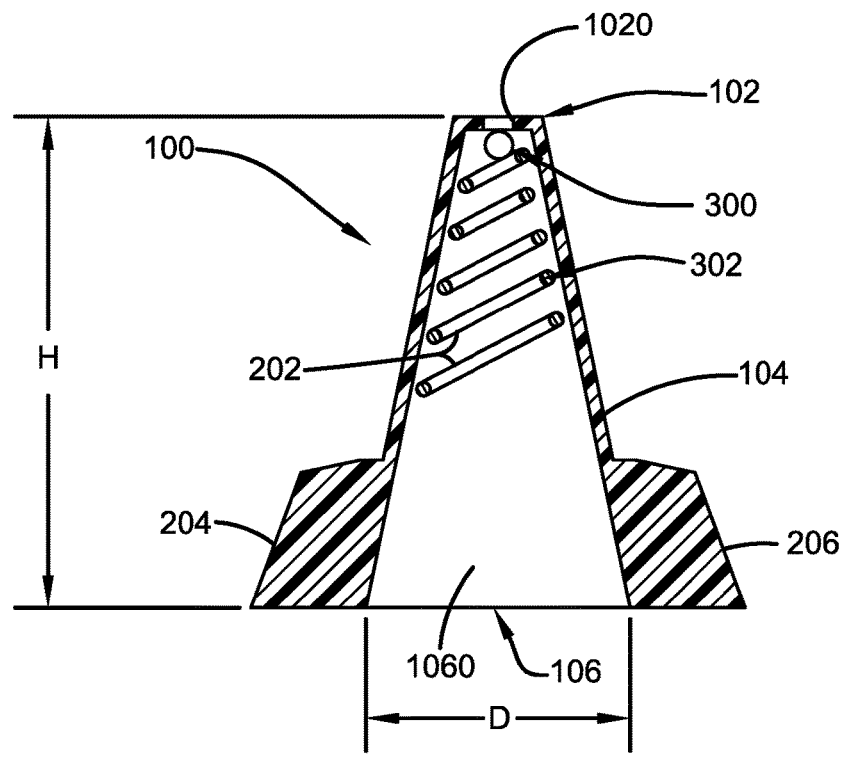
FIG. 3 illustrates a perspective view of the internal components of one potential embodiment of the wire nut electric connector of the present invention in accordance with the disclosed structure.

FIG. 3 illustrates a perspective view of the internal components of one potential embodiment of the wire nut electric connector 100 of the present invention in accordance with the disclosed structure. More specifically, the improved wire nut or electric connector 100 of the present invention has an internal metal spiral thread 302 along with a metal connector or closed end 300 in the form of a small metal ball. The metal ball 300 is proximal to, and recessed below, the top end 102 and is aligned with the central hole 1020 such that a probe tip of a tester lead inserted from the hole 1020 is directed toward the metal ball 300. The metal ball 300 in contact with the metal spiral 302, will indicate continuity of electrical connection if it exists with the wire leads contained therein. A plurality of wire leads may be permanently or removably connected to the metal spiral 302 and extend from the opening 1060 of the connector 100. It is to be appreciated that the recessed metal ball 300 is protected from inadvertent contact with any surface in and around the housing 104. Protecting inadvertent contact of the metal ball 300 with a metal surface (i.e. electrical box) protects the integrity of the electrical connection contained within the housing 104.

The internal metal spiral 302 is fixed and can be threaded within the internal surface of the connector 100 for a secure and stable gripping for the wire leads and metal ball. The internal metal spiral 302 can be in the form of a square wire spring or cone-shaped spring for secure gripping. To replace or secure wire leads connected with the internal metal spiral 300, soldering or electrical tape is not required.

In one embodiment, the connector 100 can have the dimensions of 20 mm in height (H) and 10 mm in diameter (D), wherein the diameter is of the bottom end 106 of the housing 104. Alternatively, the connector 100 can have the dimensions of 26 mm in height (H) and 15 mm in diameter (D) wherein the diameter is of the bottom end 106 of the housing 104.

Figure 4:
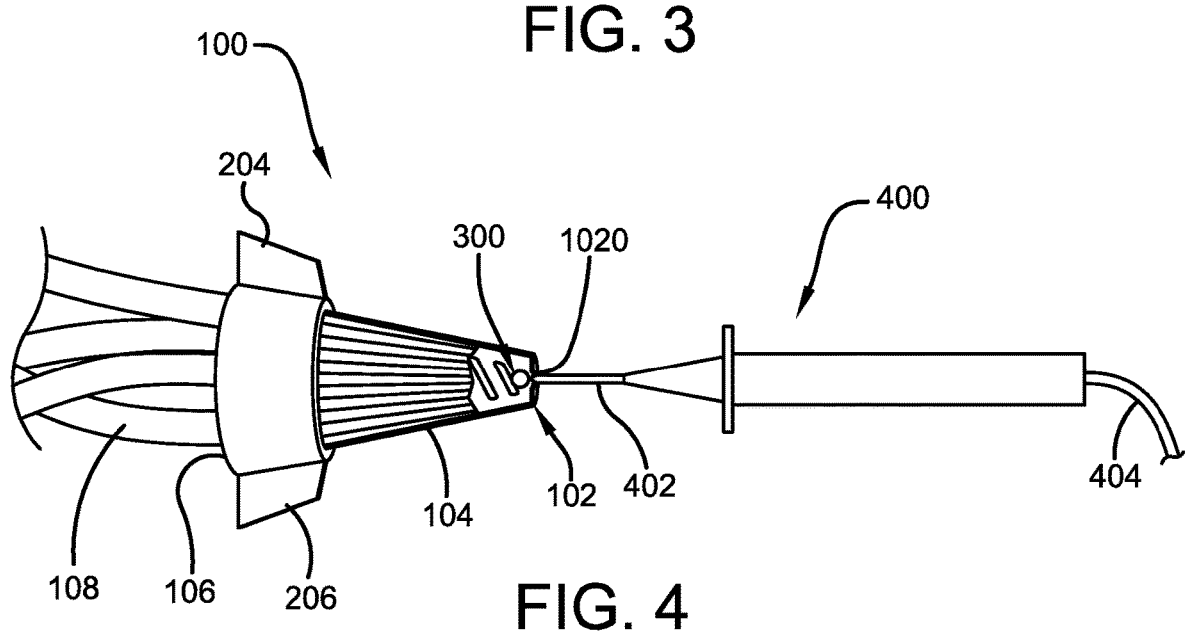
FIG. 4 illustrates a perspective view of one potential embodiment of the wire nut electric connector of the present invention in accordance with the disclosed structure, wherein a probe is being used to test the wires within the connector without having to dismantle the connection.

FIG. 4 illustrates a perspective view of one potential embodiment of the wire nut electric connector 100 of the present invention in accordance with the disclosed structure, wherein a probe is being used to test the wires within the connector 100 without having to dismantle the connection. As shown, a tester lead 400 connected to a digital multimeter or other electric unit measuring device through a wire 404, is used for probing and testing wires connected to the improved wire nut 100 of the present invention. More specifically, a probe tip 402 of the tester lead 400 is inserted into the hole 1020 on the top end 102 of the connector 100. The hole 1020 is dimensioned so that the probe tip 402 easily inserts into the hole 1020 in a secure and stable manner. When inserted, the probe tip 402 is guided to, and makes contact with, the metal ball 300 present within the housing 104 of the connector 100 for checking the electrical status of wire leads 108.

The wire leads 108 connected to the internal metal spiral thread 302 that is further connected to the metal ball 300 allows the probe tip 402 to test current and voltage value without removing the connector cap. Also, when the connector 100 is used as a wire nut, then the testing is performed without taking the connection apart from the target wiring or circuit. Thus, the testing is completed advantageously while the wire leads 108 are in their active use position.

Figure 5:
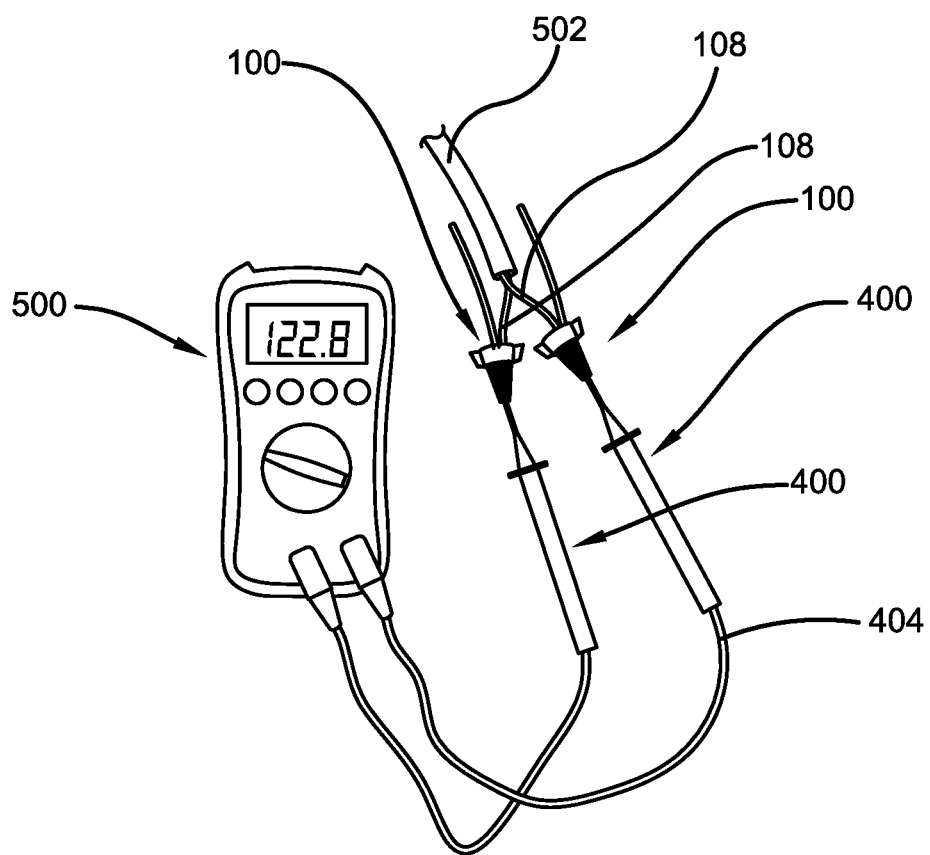
FIG. 5 illustrates a perspective view of one potential embodiment of two separate wire nut electric connectors of the present invention in accordance with the disclosed structure, wherein a probe is being used to test the wires within the connectors without having to dismantle the connections.

FIG. 5 illustrates a perspective view of one potential embodiment of two separate wire nut electric connectors 100 of the present invention in accordance with the disclosed structure, wherein a probe is being used to test the wires within the connectors 100 without having to dismantle the connections. More specifically, the electrical connector 100 is designed to receive a tester probe without removing any connector cap to test a target wiring 502. A plurality of wire leads 108, extending from the connector 100 make connections with the target wiring 502, to allows the tester lead to measure continuity and other electric parameters using the measuring device 500.

It should be noted that using the connector 100, the correct measurement of the target wiring is performed since the wire lead is connected to the desired wiring, even when a plurality of minute wires surrounds the target wiring. The tester device 400 is connected to the measuring device 500 using one or more wires 404 and the measuring device 500 displays the measured values. The connector 100 does not require the probing lead 402 of the tester device 400 to be in direct contact with the target wiring and thus allows a secure, safe and quick process of measuring electric parameters and continuity of the circuit. Even in the presence of multiple wires, the connector 100 offers an easy and correct method of measuring electric parameters.

The wire leads 108 of the connector 100 may become threaded, twisted or pressed together with the target wire for creating electrical continuity. The wire nut or connector 100 of the present invention is designed to test electrical connectivity and parameters simply and expeditiously by connecting a tester lead on the top end of the connector without altering or disturbing the electrical connection and removing the connector cap.

Certain terms are used throughout the following description and claims to refer to particular features or components. As one skilled in the art will appreciate, different persons may refer to the same feature or component by different names. This document does not intend to distinguish between components or features that differ in name but not structure or function. As used herein "improved wire nut or electrical connector", "connector", "electrical connector" and "improved wire nut" are interchangeable and refer to the improved wire nut or electrical connector 100 of the present invention.

Notwithstanding the forgoing, the improved wire nut or electrical connector 100 of the present invention can be of any suitable size and configuration as is known in the art without affecting the overall concept of the invention, provided that it accomplishes the above-stated objectives. One of ordinary skill in the art will appreciate that the size, configuration and material of the improved wire nut or electrical connector 100 as shown in the FIGS. are for illustrative purposes only, and that many other sizes and shapes of the improved wire nut or electrical connector 100 are well within the scope of the present disclosure. Although the dimensions of the improved wire nut or electrical connector 100 are important design parameters for user convenience, the improved wire nut or electrical connector 100 may be of any size that ensures optimal performance during use and/or that suits the user's needs and/or preferences.

Various modifications and additions can be made to the exemplary embodiments discussed without departing from the scope of the present invention. While the embodiments described above refer to particular features, the scope of this invention also includes embodiments having different combinations of features and embodiments that does not include all of the described features. Accordingly, the scope of the present invention is intended to embrace all such alternatives, modifications, and variations as fall within the scope of the claims, together with all equivalents thereof.

What has been described above includes examples of the claimed subject matter. It is, of course, not possible to describe every conceivable combination of components or methodologies for purposes of describing the claimed subject matter, but one of ordinary skill in the art may recognize that many further combinations and permutations of the claimed subject matter are possible. Accordingly, the claimed subject matter is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A wire lead connector for retaining and testing at least two wire leads connected therewith, the connector comprising:
  a connector housing having an open bottom end and a partially open top end including a length therebetween;
  said bottom end having a first circumference;
  said partially open top end having a second outer circumference;
  said first circumference larger than said second circumference;
  said connector housing tapering from said bottom end circumference to said top end circumference;
  an internal metal spiral threaded and fixed into an internal surface of the connector housing, comprising a cone-shaped wire spring, and having an open bottom end and a closed top end including a length therebetween;

said internal metal spiral tapering from said bottom end to said top end;

said internal metal spiral length less than said connector housing length;

said internal metal spiral taper corresponding to said connector housing taper; and said closed top end recessed below said connector housing partially open top end; and wherein the connector housing is flame-resistant; and wherein the connector housing is 26 millimeters in length and the bottom end of the connector housing is 15 millimeters in diameter.

2. The wire lead connector of claim 1, wherein said partially open top end comprises a central hole for receiving a testing probe of a tester device.

3. The wire lead connector of claim 2, wherein said closed top end comprises a metal ball for contact with the testing probe of a tester device.

4. The wire lead connector of claim 3, wherein said closed top end is spaced below and aligned with said central hole.

5. The wire lead connector of claim 4, wherein said central hole guides the testing probe of a tester device to said metal ball.

6. The wire lead connector of claim 4, wherein said connector housing is thermoplastic material including electrical insulation.

7. The wire lead connector of claim 1, wherein said connector housing bottom end including a pair of opposing tabs extending outwardly therefrom for gripping and rotating said connector housing.

* * * * *